US009140738B2

(12) United States Patent
Shimizu et al.

(10) Patent No.: US 9,140,738 B2
(45) Date of Patent: Sep. 22, 2015

(54) ELECTROSTATIC CAPACITANCE DETECTION DEVICE (71) Applicant: KABUSHIKI KAISHA TOKAI RIKA DENKI SEISAKUSHO, Aichi (JP)

(72) Inventors: Tomomi Shimizu, Aichi (JP); Takeshi Sawada, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 92 days.

(21) Appl. No.: 13/901,950

(22) Filed: May 24, 2013

(65) Prior Publication Data
US 2013/0321003 A1 Dec. 5, 2013

(30) Foreign Application Priority Data
May 31, 2012 (JP) ................ 2012-124069

(51) Int. Cl.
G01R 27/26 (2006.01)
G06F 3/044 (2006.01)

(52) U.S. Cl.
CPC ............ *G01R 27/2605* (2013.01); *G06F 3/044* (2013.01); *G06F 2203/04107* (2013.01)

(58) Field of Classification Search
USPC .......... 324/663, 686, 679, 658, 688; 73/504.14, 431, 504.12; 349/38, 123, 349/149, 139, 138, 59; 345/174, 173, 87; 257/532, 59, E33.012, E33.062; 361/277
See application file for complete search history.

(56) References Cited

U.S. PATENT DOCUMENTS

| 7,151,227 | B2 * | 12/2006 | Shigetaka | 174/254 |
| 2006/0125490 | A1 * | 6/2006 | Yoshida et al. | 324/662 |
| 2010/0220071 | A1 * | 9/2010 | Nishihara et al. | 345/173 |
| 2010/0241206 | A1 * | 9/2010 | Truex et al. | 607/116 |
| 2011/0018560 | A1 * | 1/2011 | Kurashima | 324/679 |
| 2011/0095770 | A1 * | 4/2011 | Kurashima | 324/679 |
| 2011/0157762 | A1 * | 6/2011 | Kurashima | 361/277 |

FOREIGN PATENT DOCUMENTS

JP 2009-169720 A 7/2009

* cited by examiner

*Primary Examiner* — Melissa Koval
*Assistant Examiner* — Nasima Monsur
(74) *Attorney, Agent, or Firm* — Roberts Mlotkowski Safran & Cole P.C.

(57) ABSTRACT

An electrostatic capacitance detection device includes a substrate having a predetermined thickness, an electrode layer formed on a front surface of the substrate in a predetermined pattern including electrodes to be touched so as to detect an electrostatic capacitance and wirings drawn from the electrodes, and a shield layer formed on a rear surface of the substrate and into a shield pattern corresponding to the predetermined pattern of the electrode layer. The shield pattern of the shield layer is formed surrounding the electrodes without overlapping with the electrodes, surrounding the wirings, and between the wirings when viewed in the thickness direction of the substrate.

8 Claims, 6 Drawing Sheets

|  | | COMPARATIVE EXAMPLE 1 | COMPARATIVE EXAMPLE 2 | EMBODIMENT | COMPARATIVE EXAMPLE 3 | COMPARATIVE EXAMPLE 4 |
|---|---|---|---|---|---|---|
| SMART | AVE | 1.89 | 1.56 | 1.4 | 1.12 | 0.64 |
| | PEAK | 1.68 | 1.22 | 1 | 0.87 | 0.42 |
| LW | AVE | 2.98 | 2.8 | 2.58 | 2.16 | 1.58 |
| | PEAK | 2.58 | 2.43 | 2.2 | 1.87 | 1.31 |
| AM | AVE | 3.27 | 3.1 | 2.89 | 2.81 | 2.28 |
| | PEAK | 2.12 | 1.87 | 1.8 | 1.65 | 1.36 |
| SW | AVE | 3.85 | 3.84 | 3.83 | 3.81 | 3.79 |
| | PEAK | 3.18 | 3.16 | 3.06 | 3.17 | 3.13 |

ELECTROSTATIC CAPACITANCE
DETECTION DEVICE

The present application is based on Japanese patent application No. 2012-124069 filed on May 31, 2012, the entire contents of which are incorporated herein by reference.

BACKGROUND OF THE INVENTION

1. Field of the Invention

This invention relates to an electrostatic capacitance detection device and, in particular, to an electrostatic capacitance detection device featuring a shield structure of the electrostatic capacitance detection substrate.

2. Description of the Related Art

An electrostatic capacitance detection device is known that includes a substrate, an electrode layer for detecting electrostatic capacitance, and a shield layer formed on the substrate so as to prevent EMI (electromagnetic interference) (e.g., refer to JP-A-2009-169720). The electrostatic capacitance detection device is a touch sensor including an electrode substrate on which an electrode pattern is formed, and is configured such that a shield layer comprised of a transparent conductive film is formed in an outer circumferential region in plane with the electrode pattern of the electrode substrate, and an output wiring and the like electrically connected to the electrode pattern are formed above the shield layer.

According to the electrostatic capacitance detection device, the shield layer comprised of a transparent conductive film is formed between the output wiring and the electrode substrate, thereby even if a finger or the like touches or comes close to an output wiring part in which a plurality of output wirings are formed, namely a shield region, the electrostatic capacitances of the finger or the like and the output wiring can be prevented from being combined with each other by the shield layer in the part that the finger or the like has touched or come close to. Consequently, in the part that the finger or the like has touched or come close to, noise due to change in capacitance can be prevented from being transmitted to the output wiring and the like, and it can be prevented to erroneously detect as if an input were carried out in the sensor part, despite no input thereto, thus an occurrence of malfunction can be prevented. In addition, noise due to change in capacitance does not occur, and the threshold value of the input detection can be easily set, thus the device is regarded as a device that is capable of carrying out an accurate input detection.

SUMMARY OF THE INVENTION

In the conventional electrostatic capacitance detection device, there are problems that detection sensitivity is lowered due to increase in parasitic capacitance between the electrode layer and the shield layer, and if EMI-prevention is carried out by reducing the electrode area, operability is lowered due to decrease in the operating area.

Accordingly, it is an object of the invention to provide an electrostatic capacitance detection device that is capable of satisfying both of maintaining the detection sensitivity and carrying out the EMI-prevention without decrease in the electrode area and increase in the shield area.

(1) According to one embodiment of the invention, an electrostatic capacitance detection device comprises:

a substrate having a predetermined thickness;

an electrode layer formed on a front surface of the substrate in a predetermined pattern comprising electrodes to be touched so as to detect an electrostatic capacitance and wirings drawn from the electrodes; and a shield layer formed on a rear surface of the substrate and into a shield pattern corresponding to the predetermined pattern of the electrode layer, wherein the shield pattern of the shield layer is formed surrounding the electrodes without overlapping with the electrodes, surrounding the wirings, and between the wirings when viewed in the thickness direction of the substrate.

In the above embodiment (1) of the invention, the following modifications and changes can be made.

(i) The shield layer formed surrounding the wirings and between the wirings is partially overlapped with the wirings when viewed in the thickness direction of the substrate.

(ii) All the shield layers including the shield layer formed between the wirings are formed to be electrically connected to each other.

(iii) The shield layer comprises a mesh structure.

(iv) The shield patterns formed surrounding the wirings and between the wirings comprise a linear shape.

(v) The shield patterns formed surrounding the wirings and between the wirings comprise a connection part to connect with each other.

(vi) The connection part comprises a linear shape.

(vii) The shield pattern of the shield layer is, when viewed in the thickness direction of the substrate, formed to have a frame shape around the electrodes and formed to have a linear shape around the wirings and between the wirings, and wherein the linear shield pattern is formed along a longitudinal direction of the frame-shaped shield pattern.

Points of the Invention

According to one embodiment of the invention, an electrostatic capacitance detection device is constructed such that an electrode layer and a shield layer are formed on the front surface and the rear surface, respectively, of a base film. In addition, the electrode layer and the shield layer are formed such that they are not overlapped with each other when viewed in the thickness direction of the base film except for a part of the connection parts to connect patterns of the shield layer. Namely, the shield layer can be formed so as to minimize the overlap part with the electrode layer, and shield all the surrounding regions of the electrode and the wiring (i.e., the electrode layer). Therefore, it is possible to reduce the parasitic capacitance and realize an effective EMI-prevention.

BRIEF DESCRIPTION OF THE DRAWINGS

The preferred embodiments according to the invention will be explained below referring to the drawings, wherein:

FIG. 4D shows Comparative Examples 4, and is a transparent plan view schematically showing a front surface 20a of a base film 20 of an electrostatic capacitance detection device (a sensor sheet 10) according to the embodiment of the invention when viewed from the direction A shown in FIG. 1 so as to be seen through;

DETAILED DESCRIPTION OF THE PREFERRED EMBODIMENTS

Embodiment of the Invention

Configuration of Electrostatic Capacitance Detection Device

Figure 1:
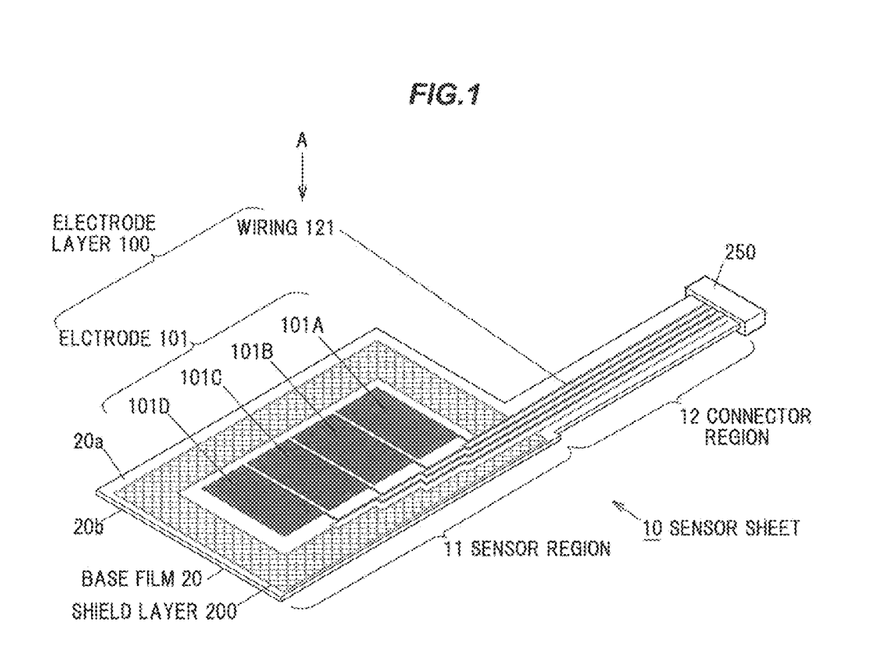
FIG. 1 is a perspective view schematically showing an electrostatic capacitance detection device according to one embodiment of the invention.

FIG. 1 is a perspective view schematically showing an electrostatic capacitance detection device according to one embodiment of the invention. Generally, an electrostatic capacitance detection device is configured to include a touch detection electrode part and a control part thereof, but the electrode parasitic capacitance according to the embodiment of the invention is corresponding to the above-mentioned touch detection electrode part. The above-mentioned control part is conventionally known as various techniques, that is configured to apply a predetermined voltage to the touch detection electrode part so as to detect decrease in the voltage due to touch operation. Consequently, a sensor sheet 10 as the electrostatic capacitance detection device according to the embodiment of the invention described below is a main constituting part of the electrostatic capacitance detection device and functions as the electrostatic capacitance detection device.

The sensor sheet 10 as the electrostatic capacitance detection device of the embodiment of the invention is configured to include a base film 20 that is a substrate formed to have a predetermined thickness (t), an electrode layer 100 formed on the front surface 20a of the base film 20 in a predetermined pattern comprised of electrodes 101 (i.e., 101A, 101B, 101C, 101D) configured to be touched for detecting the electrostatic capacitance by an operator of the device and a wiring 121 configured to be drawn from the electrodes 101, and a shield layer 200 formed on the rear surface 20b of the base film 20 in a shield pattern corresponding to the predetermined pattern of the electrode layer 100. The shield pattern of the shield layer 200 is formed at the surrounding parts of the electrode 101 without overlapping with the electrode 101, at the surrounding parts of the wiring 121 without overlapping with the wiring 121, and at the gap portions between two of the wiring 121, when viewed in the thickness (t) direction of the base film 20.

Sensor Sheet 10

The sensor sheet 10 is a flexible printed circuit (FPC) board configured such that the electrodes 101, the wiring 121 and the shield layer 200 are formed of conductive foil or the like on the base film 20 that is an insulating material of a film-like shape with a thickness (t) (generally, the thickness is approximately 12 to 50 μm). The wirings 121 drawn from the electrodes 101 are electrically connected to a connector 250 on the opposite side of the electrodes 101. The sensor sheet 10 is configured to be connected to a control part by the connector 250 and be capable of detecting voltage application for detecting electrostatic capacitance, and electrostatic capacitance due to change in voltage or the like so as to function as an electrostatic capacitance detection device.

Electrode Layer 100

Figure 2:
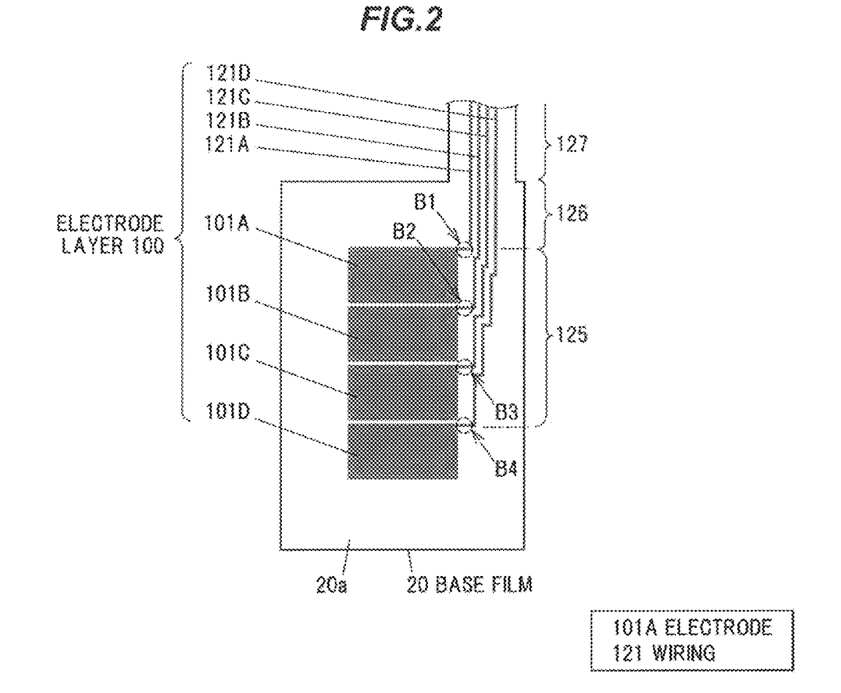
FIG. 2 is a top view schematically showing a front surface of a base film of the electrostatic capacitance detection device according to the embodiment of the invention when viewed from the direction A as shown in FIG. 1.

FIG. 2 is a top view schematically showing the front surface 20a of the base film 20 of the sensor sheet 10 of the embodiment of the invention when viewed from the direction A shown in FIG. 1. The electrodes 101 (i.e., 101A, 101B, 101C, 101D) are formed of conductive foil or the like on the front surface 20a of the base film 20 of the sensor sheet 10, and wirings 121A, 121B, 121C and 121D are drawn from the respective electrodes 101A, 101B, 101C and 101D, respectively.

In the embodiment, the number of the electrode 101 is configured to be four, it is not particularly limited to this.

The wiring 121 is configured to include the wirings 121A, 121B, 121C and 121D that are drawn from the electrodes 101A, 101B, 101C and 101D, respectively, and reach the connector 250. The wiring 121 is also configured to include a drawing part 125 drawn from the electrodes 101A, 101B, 101C, 101D at an angle, a sensor straight line part 126 wired in the sensor region 11 linearly and a connector wiring part 127 wired in the connector region 12.

Shield Layer 200

Figure 3:
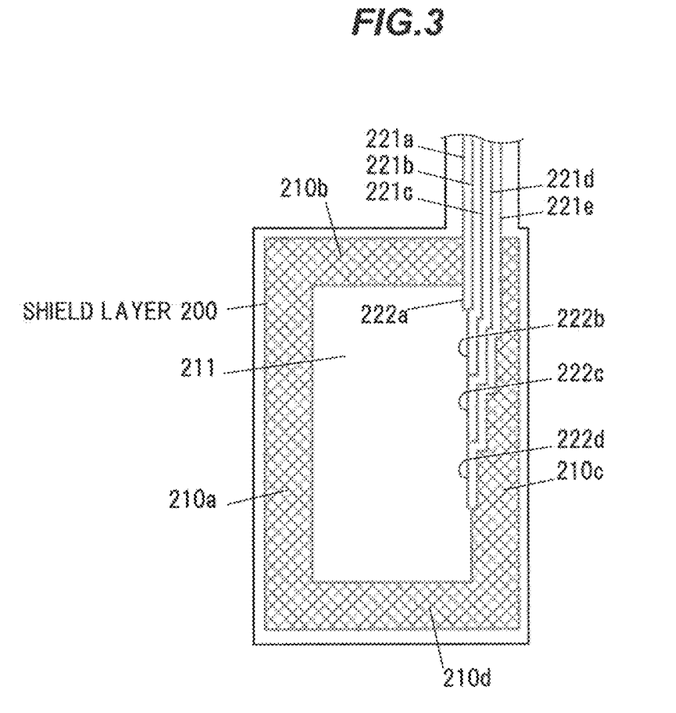
FIG. 3 is a transparent plan view schematically showing a rear surface of the base film of the electrostatic capacitance detection device according to the embodiment of the invention when viewed from the direction A as shown in FIG. 1 so as to be seen through, and by being shown as the above-mentioned transparent plan view, an overlap relation, when viewed in the thickness direction of the base film, between the electrode layer of the front surface of the base film and the shield layer of the rear surface of the base film shown in FIG. 1 can be easily grasped.

FIG. 3 is a transparent plan view schematically showing the rear surface 20b of the base film 20 of the electrostatic capacitance detection device (the sensor sheet 10) according to the embodiment of the invention when viewed from the direction A shown in FIG. 1 so as to be seen through, and by being shown as the above-mentioned transparent plan view, an overlap relation, when viewed in the thickness (t) direction of the base film 20, between the electrode layer 100 of the front surface 20a of the base film 20 and the shield layer 200 of the rear surface 20b of the base film 20 shown in FIG. 1 can be easily grasped.

The shield layer 200 is formed on the rear surface 20b of the base film 20 in a shield pattern corresponding to the predetermined pattern of the electrode layer 100. Namely, the shield pattern of the shield layer 200 is formed surrounding the electrode 101 without overlapping with the electrode 101 and surrounding the wiring 121 without overlapping with the wiring 121, when viewed in the thickness (t) direction of the base film 20. Also, the shield pattern is formed between the wirings 121.

As shown in FIG. 3, the shield layer 200 is formed at the surrounding regions 210a, 210b, 210c, 210d of the electrodes 101 without overlapping with the electrodes 101 so as to have a frame-shaped and meshed shield pattern as a whole, when viewed in the thickness (t) direction of the base film 20. Consequently, so as not to overlap with the electrodes 101 when viewed in the thickness (t) direction of the base film 20, at least the part 211 corresponding to the overlap region of the electrode 101 is not provided with the shield layer. Further, the shield layer may be formed as a solid pattern instead of the meshed pattern.

Also, the shield layer 200 is formed surrounding the wiring 121 without overlapping with the wiring 121 so as to have linear patterns, when viewed in the thickness (t) direction of the base film 20. Namely, the shield layer 200 is also formed into the linear surrounding patterns 221a, 221b, 221c, 221d and 221e as shown in FIG. 3.

Also, as shown in FIG. 3, linear connection parts 222a, 222b, 222c, 222d are formed in order to electrically connect the linear surrounding patterns 221a, 221b, 221c, 221d and 221e to each other and to the frame-shaped surrounding regions 210a, 210b, 210c, 210d. The connection part 222a is configured to connect the surrounding region 210b and the surrounding pattern 221a, and the surrounding pattern 221b and the connection part 222b. The connection part 222b is configured to connect the connection part 222a and the surrounding pattern 221b, and the surrounding pattern 221c and the connection part 222c. The connection part 222c is configured to connect the connection part 222b and the surrounding pattern 221c, and the surrounding pattern 221d and the connection part 222d. The connection part 222d is configured to connect the connection part 222c and the surrounding pattern 221d, and the surrounding pattern 221e and the surrounding region 210c.

Meanwhile, the connection parts 222a, 222b, 222c, 222d partially overlap with the wirings 121A, 121B, 121C and 121D, respectively, in the regions B1, B2, B3, B4 shown in FIG. 2, when viewed in the thickness (t) direction of the base film 20.

As mentioned above, the sensor sheets 10 in which the electrode layer 100 and the shield layer 200 are formed are respectively formed on the front surface 20a and the rear surface 20b of the base film 20, thus the sensor sheets 10 are configured to be separated from each other in the thickness (t) direction of the base film 20. In addition, the electrode layer 100 and the shield layer 200 are formed in such a pattern that those layers 100, 200 are not overlapped with each other when viewed in the thickness (t) direction of the base film 20 except for a part of the connection parts 222a, 222b, 222c, 222d. Namely, the shield layer 200 can minimize the overlapping with the electrode layer 100, and the shield layer 200 makes it possible to shield all the surrounding regions of the electrode 101 and the wiring 121 (i.e., the electrode layer 100). This makes it possible to reduce the parasitic capacitance and realize an effective EMI-prevention.

Comparative Example 1

Figure 4A:
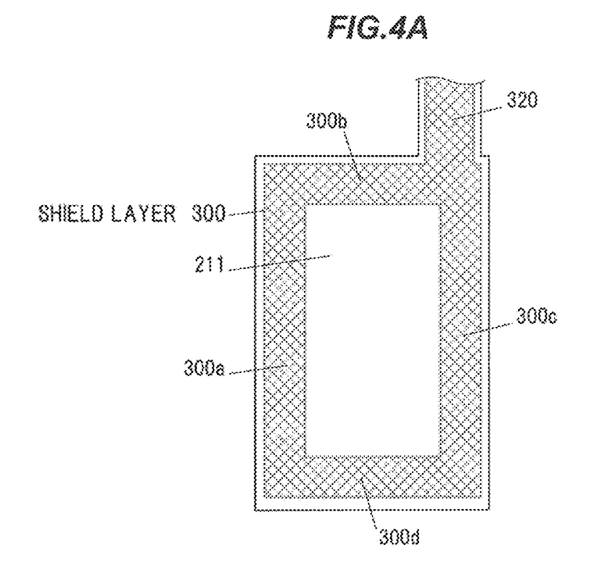
FIGS. 4A to 4C respectively show Comparative Examples 1 to 3, and are transparent plan views schematically showing the rear surface of the base film of the electrostatic capacitance detection device according to the embodiment of the invention when viewed from the direction A shown in FIG. 1 so as to be seen through, and by being shown as the above-mentioned transparent plan view, an overlap relation, when viewed in the thickness direction of the base film, between the electrode layer of the front surface of the base film and the shield layer of the rear surface of the base film shown in FIG. 1 can be easily grasped.

FIG. 4A shows Comparative Example 1, and is a transparent plan view schematically showing the rear surface 20b of the base film 20 of the electrostatic capacitance detection device (the sensor sheet 10) according to the embodiment of the invention when viewed from the direction A shown in FIG. 1 so as to be seen through. By being shown as the above-mentioned transparent plan view, an overlapping relation, when viewed in the thickness (t) direction of the base film, between the electrode layer 100 of the front surface 20a of the base film 20 and the shield layer 300 of the rear surface 20b of the base film 20 shown in FIG. 1 can be easily grasped. Comparative Example 1 is different from the embodiment according to the invention in terms of the shield layer 300, but is identical to the embodiment in terms of the other parts such as the electrode layer 100, thus hereinafter only the shield pattern of the shield layer will be explained.

Shield Layer 300 of Comparative Example 1

The shield layer 300 is formed on the rear surface 20b of the base film 20. As shown in FIG. 4A, the shield layer 300 is formed to cover the surrounding regions 300a, 300b, 300c, 300d of the electrode 101 except for the part 211 corresponding to the overlap region of the electrode 101 and the wiring 121 as well as the overlap region 320 of the wiring 121.

Comparative Example 2

Figure 4B:
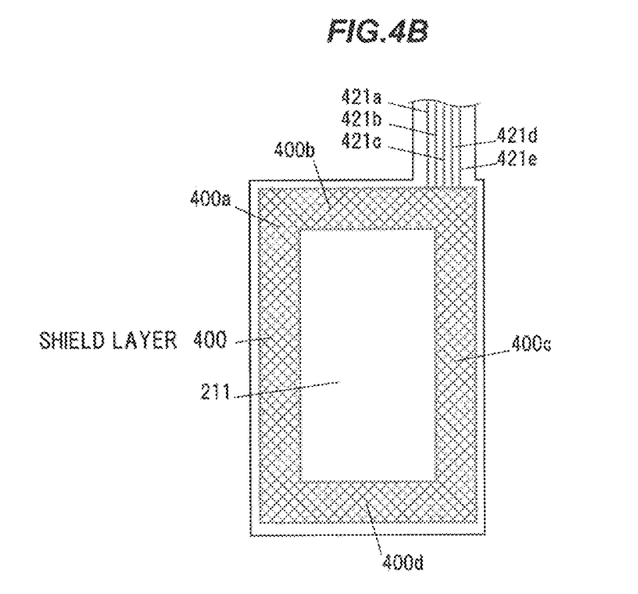

FIG. 4B shows Comparative Example 2, and is a transparent plan view schematically showing the rear surface 20b of the base film 20 of the electrostatic capacitance detection device (the sensor sheet 10) according to the embodiment of the invention when viewed from the direction A shown in FIG. 1 so as to be seen through. By being shown as the above-mentioned transparent plan view, an overlapping relation, when viewed in the thickness (t) direction of the base film, between the electrode layer 100 of the front surface 20a of the base film 20 and the shield layer 400 of the rear surface 20b of the base film 20 shown in FIG. 1 can be easily grasped. Comparative Example 2 is different from the embodiment according to the invention in terms of the shield layer 400, but is identical to the embodiment in terms of the other parts such as the electrode layer 100, thus hereinafter only the shield pattern of the shield layer will be explained.

Shield Layer 400 of Comparative Example 2

The shield layer 400 is formed on the rear surface 20b of the base film 20. As shown in FIG. 4B, the shield layer 400 is formed to cover the surrounding regions 400a, 400b, 400c, 400d of the electrode 101 except for the part 211 corresponding to the overlap region of the electrode 101, and formed between the wirings 121 (i.e., 121A, 121B, 121C, 121D) or surrounding them to be indicated by 421a, 421b, 421c, 421d, 421e.

Comparative Example 3

Figure 4C:
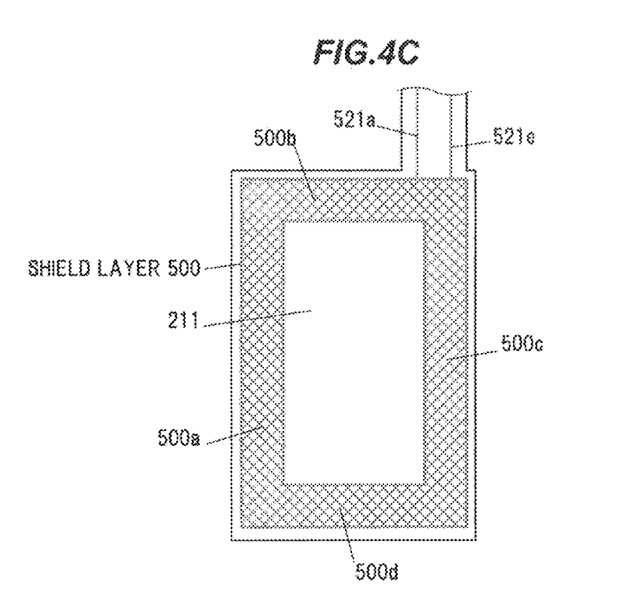

FIG. 4C shows Comparative Example 3, and is a transparent plan view schematically showing the rear surface 20b of the base film 20 of the electrostatic capacitance detection device (the sensor sheet 10) according to the embodiment of the invention when viewed from the direction A shown in FIG. 1 so as to be seen through. By being shown as the above-mentioned transparent plan view, an overlapping relation, when viewed in the thickness (t) direction of the base film, between the electrode layer 100 of the front surface 20a of the base film 20 and the shield layer 500 of the rear surface 20b of the base film 20 shown in FIG. 1 can be easily grasped. Comparative Example 3 is different from the embodiment according to the invention in terms of the shield layer 500, but is identical to the embodiment in terms of the other parts such as the electrode layer 100, thus hereinafter only the shield pattern of the shield layer will be explained.

Shield Layer 500 of Comparative Example 3

The shield layer 500 is formed on the rear surface 20b of the base film 20. As shown in FIG. 4C, the shield layer 500 is formed at the surrounding regions 500a, 500b, 500c, 500d of the electrode 101 except for the part 211 corresponding to the region of the electrode 101, and outside the wirings 121A and 121D to be indicated by 521a and 521e respectively.

Comparative Example 4

Figure 4D:
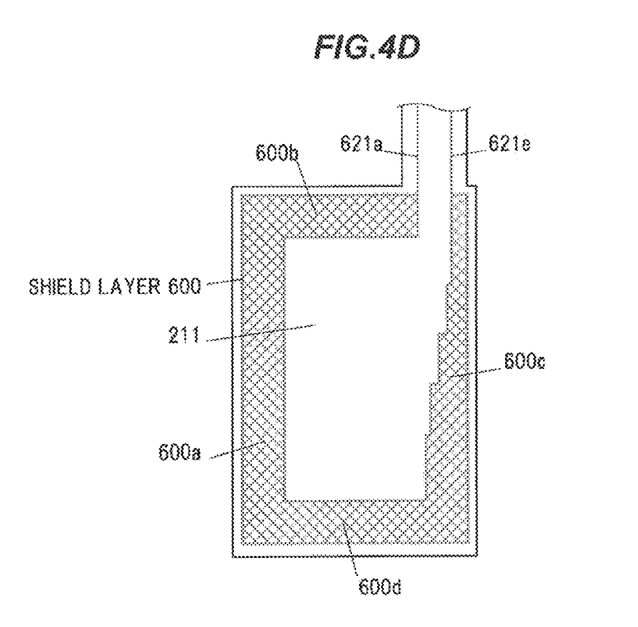

FIG. 4D shows Comparative Example 4, and is a transparent plan view schematically showing the front surface 20a of the base film 20 of the electrostatic capacitance detection device (the sensor sheet 10) according to the embodiment of the invention when viewed from the direction A shown in FIG. 1. Comparative Example 4 is different from the embodiment according to the invention in terms of the fact that the shield layer 600 is formed on the front surface 20a of the base film 20, but is identical to the embodiment in terms of the other parts such as the electrode layer 100, thus hereinafter only the shield pattern of the shield layer will be explained.

Shield Layer 600 of Comparative Example 4

The shield layer 600 is formed on the front surface 20a of the base film 20. As shown in FIG. 4D, the shield layer 600 is formed at the surrounding regions 600a, 600b, 600c, 600d of the electrode 101 except for the part 211 corresponding to the region of the electrode 101, and outside the wirings 121A and 121D to be indicated by 621a and 621e, respectively. Thus, the shield pattern is not formed between the wirings 121. Consequently, the shield layer 600 does not have the overlap part with the electrode layer 100, and is formed on the front surface 20a of the base film 20 that is identical to that of the electrode layer 100.

Operation of Electrostatic Capacitance Detection Device According to the Embodiment of the Invention The sensor sheet 10 as the electrostatic capacitance detection device according to the embodiment of the invention operates as follows so as to function as an electrostatic capacitance detection device.

The condition that voltage having a predetermined frequency (for example, 3 kHz) is applied to the electrode 101 (101A, 101B, 101C, 101D) from the control part via the connector 250 is simulated. A finger or the like touches or comes close to the electrode 101, thereby the level of voltage applied is lowered. By measuring the lowering of the level of voltage of the signal and comparing with a predetermined reference voltage, the touching or coming close to the electrode 101 can be detected. The above-mentioned example of use is merely one example, and the touching or coming close to the electrode 101 can be also detected by the other method for using.

In addition, the shield layer 200 is connected to the ground level of the control part via the connector 250. This makes it possible to reduce electromagnetic noise from the outside and reduce radiation level to the outside.

Comparison of the Embodiment of the Invention and Comparative Examples 1 to 4

Figure 5:
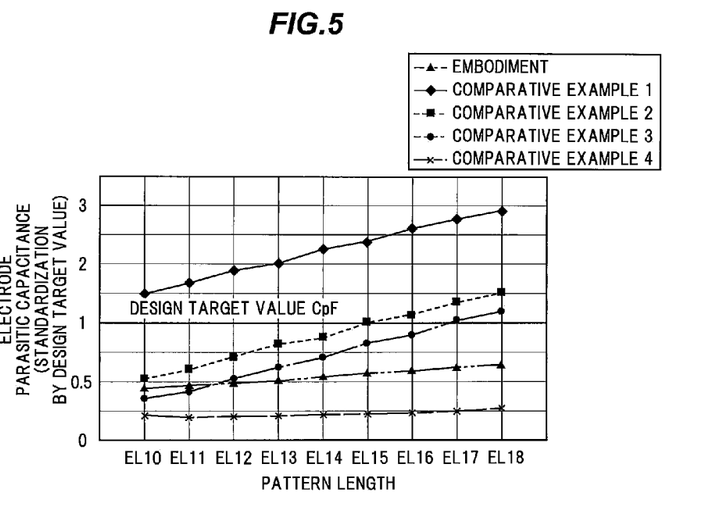
FIG. 5 is a graph showing a measurement result of parasitic capacitance that shows a relationship between the electrode of the electrostatic capacitance detection device according to the embodiment of the invention and Comparative Examples, and the electrode parasitic capacitance.

FIG. 5 is a graph showing a measurement result of parasitic capacitance that shows a relationship between the electrode of the electrostatic capacitance detection device according to the embodiment of the invention and Comparative Examples, and the electrode parasitic capacitance. The electrode pattern length was plotted along the abscissa and the electrode parasitic capacitance that was standardized by that the design target value thereof was defined as 1 was plotted along the ordinate.

With regard to 9 types of electrode pattern lengths EL10 to EL18, the measurement values of the standardized electrode parasitic capacitance of the embodiment of the invention and Comparative Examples 1 to 4 were plotted. Further, EL10 to EL18 are configured such that the electrode pattern lengths thereof become larger toward the right side of the graph.

According to FIG. 5, in the embodiment of the invention and Comparative Examples 1 to 4, the electrode parasitic capacitance is increased due to the increase in the electrode pattern length. Those in which the electrode parasitic capacitance was below the design target value C(pF) in all the electrode pattern lengths were the embodiment of the invention and Comparative Example 4.

Figure 6:
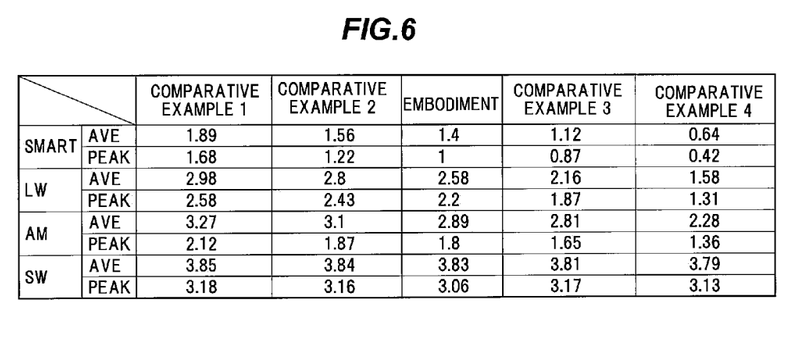
FIG. 6 is a Table showing an evaluation result of radio noise in the electrostatic capacitance detection device according to the embodiment of the invention and electrostatic capacitance detection devices according to Comparative Examples.

FIG. 6 is a Table showing an evaluation result of radio noise in the electrostatic capacitance detection device according to the embodiment of the invention and electrostatic capacitance detection devices according to Comparative Examples. The Table was obtained such that with regard to the embodiment of the invention and Comparative Examples 1 to 4, each measurement item (SWART, LW, AM, SW) was measured about an average AVE value and a PEAK value, the each measurement item being standardized by that the PEAK value of the measurement item SWART of the embodiment of the invention was defined as 1. The above-mentioned measurement was configured to measure the radio noise radiated, for example, if voltage of 4 V and 3 kHz was applied to the electrode 101.

According to FIG. 6, it was recognized that the radio noise performance was higher in order of Comparative Example 1, Comparative Example 2, the embodiment of the invention, Comparative Example 3, and Comparative Example 4.

As a result, it was recognized that from the evaluation result of the electrode parasitic capacitance shown in FIG. 5, the embodiment of the invention and Comparative Example 4 cleared the design target value C(pF), and from the evaluation of the radio noise performance shown in FIG. 6, the embodiment of the invention was superior to Comparative Example 4. Namely, when the embodiment of the invention and Comparative Example 1 to 4 were evaluated in a comprehensive manner about contradictory characteristics by two evaluation means, the embodiment of the invention was judged as best.

Advantages of the Embodiment of the Invention

According to the embodiment of the invention, the following advantages can be obtained.

(1) The shield pattern of the shield layer 200 of the sensor sheet 10 that is the embodiment of the invention is formed in the surrounding part of the electrode 101 without overlapping with the electrode 101 and in the surrounding part of the wiring 121 without overlapping with the wiring 121, when viewed in the thickness (t) direction of the base film 20. Furthermore, the shield pattern is formed between the wirings 121. Due to this, the shield layer 200 can minimize the overlapping with the electrode layer 100, and to shield all the surrounding parts of the electrode 101 and the wiring 121 (the electrode layer 100). This makes it possible to reduce the parasitic capacitance and realize an effective EMI-prevention.

(2) According to the evaluation of the electrode parasitic capacitance based on the embodiment of the invention and Comparative Examples 1 to 4, as shown in FIG. 5, the electrode parasitic capacitance is larger in order of Comparative Example 1, Comparative Example 2, Comparative Example 3, the embodiment of the invention, and Comparative Example 4. On the other hand, according to FIG. 6, the radio noise performance is higher in order of Comparative Example 1, Comparative Example 2, the embodiment of the invention, Comparative Example 3, and Comparative Example 4. Namely, the effect based on the shield layer provides a relationship of trade-off between the electrode parasitic capacitance and the radio noise performance. Consequently, the embodiment of the invention makes it possible to carry out the EMI-prevention in accordance with detection sensitivity and radiation level without change in size of the electrode.

(3) For this reason, it is unnecessary to decrease the electrode area so as to reduce the electrode parasitic capacitance for the purpose of maintaining detection sensitivity. In addition, it is unnecessary to increase the shield area for the EMI-prevention. Consequently, the embodiment of the invention is capable of satisfying both of maintaining the detection sensitivity and carrying out the EMI-prevention.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An electrostatic capacitance detection device, comprising:
    a substrate having a predetermined thickness;
    an electrode layer formed on a front surface of the substrate in a predetermined pattern comprising electrodes to be touched so as to detect an electrostatic capacitance and wirings drawn from the electrodes; and
    a shield layer formed on a rear surface of the substrate and into a shield pattern corresponding to the predetermined pattern of the electrode layer, such that the electrode layer and the shield layer are disposed on opposite sides of the substrate,
    wherein the shield pattern of the shield layer is formed surrounding the electrodes without overlapping with the electrodes, surrounding the wirings without overlapping with the wirings in a longitudinal direction thereof, and between the wirings when viewed in the thickness direction of the substrate.

2. The electrostatic capacitance detection device according to claim 1, wherein the shield layer formed surrounding the wirings and between the wirings is partially overlapped with the wirings when viewed in the thickness direction of the substrate.

3. The electrostatic capacitance detection device according to claim 2, wherein all the shield layers including the shield layer formed between the wirings are formed to be electrically connected to each other.

4. The electrostatic capacitance detection device according to claim 1, wherein the shield layer comprises a mesh structure.

5. The electrostatic capacitance detection device according to claim 1, wherein the shield patterns formed surrounding the wirings and between the wirings comprise a linear shape.

6. The electrostatic capacitance detection device according to claim 1, wherein the shield patterns formed surrounding the wirings and between the wirings comprise a connection part to connect with each other.

7. The electrostatic capacitance detection device according to claim 6, wherein the connection part comprises a linear shape.

8. The electrostatic capacitance detection device according to claim 1, wherein the shield pattern of the shield layer is, when viewed in the thickness direction of the substrate, formed to have a frame shape around the electrodes and formed to have a linear shape around the wirings and between the wirings, and wherein the linear shield pattern is formed along a longitudinal direction of the frame-shaped shield pattern.

* * * * *